United States Patent
Manohararajah et al.

(10) Patent No.: US 8,201,114 B1
(45) Date of Patent: Jun. 12, 2012

(54) METHOD AND APPARATUS FOR PERFORMING LOOK UP TABLE UNPACKING AND REPACKING FOR RESYNTHESIS

(75) Inventors: Valavan Manohararajah, Scarborough (CA); Gordon Raymond Chiu, Richmond Hill (CA); John Stuart Freeman, Etobicoke (CA)

(73) Assignee: Altera Corporation, San Jose, CA (US)

( * ) Notice: Subject to any disclaimer, the term of this patent is extended or adjusted under 35 U.S.C. 154(b) by 232 days.

(21) Appl. No.: 12/590,933

(22) Filed: Nov. 17, 2009

(51) Int. Cl.
*G06F 17/50* (2006.01)

(52) U.S. Cl. ........ 716/104; 716/103; 716/116; 716/121; 716/124; 716/131; 716/132

(58) Field of Classification Search ................ 716/103, 716/104, 116, 121, 124, 131, 132
See application file for complete search history.

(56) References Cited

U.S. PATENT DOCUMENTS

| | | | |
|---|---|---|---|
| 6,212,670 B1* | 4/2001 | Kaviani | 716/105 |
| 6,336,208 B1* | 1/2002 | Mohan et al. | 716/113 |
| 7,075,332 B1* | 7/2006 | Young et al. | 326/38 |
| 7,111,273 B1* | 9/2006 | Ganesan et al. | 326/39 |
| 7,337,100 B1* | 2/2008 | Hutton et al. | 703/13 |
| 7,373,630 B1* | 5/2008 | Yuan | 716/103 |
| 7,386,812 B2* | 6/2008 | Gliese et al. | 716/105 |
| 7,594,204 B1* | 9/2009 | Singh et al. | 716/132 |
| 7,610,566 B1* | 10/2009 | Caldwell et al. | 716/132 |
| 7,814,452 B1* | 10/2010 | Jang et al. | 716/100 |
| 2010/0138804 A1* | 6/2010 | Tian et al. | 716/16 |

* cited by examiner

*Primary Examiner* — Phallaka Kik
(74) *Attorney, Agent, or Firm* — L. Cho

(57) ABSTRACT

A method for optimizing a system on a target device is disclosed. A LUT is unpacked to form a plurality of LUTs of a smaller size upon determining that the unpacking can satisfy one or more predefined objectives. The plurality of LUTs are repacked such that the design for the system is improved. Other embodiments are disclosed.

30 Claims, 9 Drawing Sheets

METHOD AND APPARATUS FOR PERFORMING LOOK UP TABLE UNPACKING AND REPACKING FOR RESYNTHESIS

FIELD

Embodiments of the present invention relate to tools for designing systems on target devices. More specifically, embodiments of the present invention relate to a method and apparatus for performing look up table unpacking and repacking for resynthesis.

BACKGROUND

Electronic designs for large systems may include millions of gates and megabits of embedded memory. Of the tasks required for managing and optimizing electronic designs on a target device, synthesis, placement, and routing utilizing available resources can be among the most challenging and time consuming. The complexity of large systems often requires the use of computer aided design (CAD) or electronic design automation (EDA) tools to manage and optimize designs. CAD tools perform the time-consuming tasks of synthesis, placement, and routing on a target device.

During synthesis, some CAD tools perform register transfer level (RTL) synthesis which includes optimization of large/coarse design blocks, gate level synthesis which includes the optimization of simpler design blocks such as logic gates, and gate decomposition where large gates are broken down into smaller 2 input gates. Technology mapping is also performed during synthesis where the types of resources available on the target device, such as look up tables (LUTs), are selected to implement the simple 2 input gates of system.

In order to improve the system design, a resynthesis procedure may be performed after synthesis, placement, and/or routing to re-evaluate some synthesis decisions following procedure performed on the system design that may have an impact on delay and area such as clustering or placement. Some resynthesis approaches performed in the past made drastic changes to an existing netlist generated after synthesis which required extensive changes in placement and/or routing. Many of the resynthesis approaches utilized slow analysis methods which were undesirable.

BRIEF DESCRIPTION OF THE DRAWINGS

The features and advantages of embodiments of the present invention are illustrated by way of example and are not intended to limit the scope of the embodiments of the present invention to the particular embodiments shown.

SUMMARY

According to an exemplary embodiment of the present invention, a method and apparatus for performing LUT unpacking and repacking is disclosed. A determination of whether a LUT can be unpacked to satisfy one or more predefined objectives is made. According to one embodiment, the predefined objectives may include objectives directed towards extracting a smaller LUT with variables that are not timing critical, extracting a smaller LUT with variables that have high fanout, extracting a smaller LUT with variables that appear together in a netlist, and using a preexisting smaller LUT to simplify the LUT. If unpacking the LUT can satisfy one of the predefined objectives, the LUT is unpacked to a plurality of LUTs of smaller sizes. The plurality of smaller size LUTs are repacked to larger size LUTs such that the design for the system is improved. The improvement may include optimization to delay, area, power and/or other parameters.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
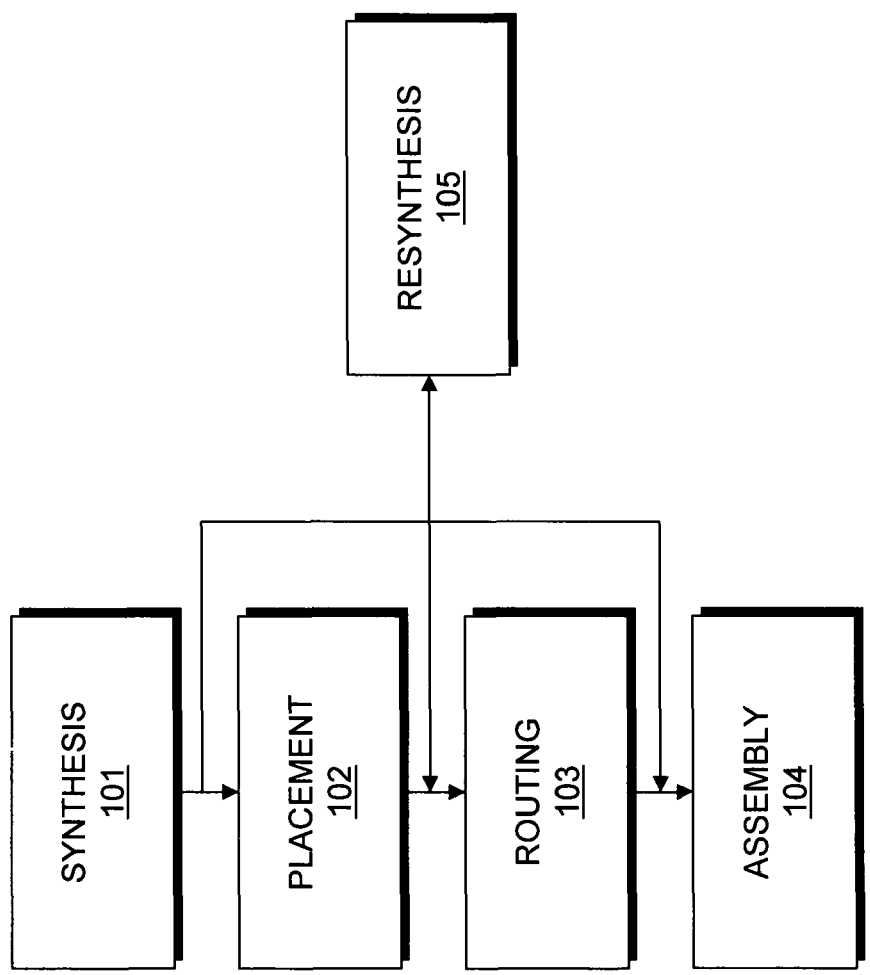
FIG. 1 is a flow chart illustrating a method for designing a system according to an exemplary embodiment of the present invention.

FIG. 1 is a flow chart illustrating a method for designing a system on a target device according to an exemplary embodiment of the present invention. The target device may be an FPGA, ASIC, a structured ASIC, or other device. According to one embodiment, the procedure illustrated in FIG. 1 may be performed by a computer aided design (CAD)/electronic design automation (EDA) tool implemented on a computer system. At 101, the system is synthesized. Synthesis includes generating a logic design of the system to be implemented. According to an embodiment of the present invention, synthesis generates an optimized logical representation of the system from the HDL design definition. The optimization may involve RTL synthesis where large/course bocks are optimized and gate level synthesis where simple blocks are optimized. The optimized logical representation of the system may include a representation that has a minimized number of functional blocks and registers ("components"), such as logic gates and logic elements, required for the system. Synthesis also includes mapping the optimized logic design (technology mapping). Mapping includes determining how to implement logic gates and logic elements in the optimized logic representation with resources available on the target device. The resources available may include LUTs and other resources. According to an embodiment of the present invention, a netlist is generated from mapping. This netlist may be an optimized technology-mapped netlist generated from the HDL.

At 102, components in the mapped logical system design are placed. Placement works on the optimized technology-mapped netlist to produce a placement for each of the functional blocks. According to an embodiment of the present invention, placement includes fitting the system on the target device by determining which resources on the logic design are to be used for specific logic elements, and other function blocks determined to implement the system as determined during synthesis. Placement may include clustering which involves grouping logic elements together to form the logic clusters present on the target device. According to an embodiment of the present invention, clustering is performed at an early stage of placement and occurs directly after synthesis during the placement preparation stage.

At 103, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 104, resynthesis is performed. According to an embodiment of the present invention, resynthesis involves unpacking components in the system design represented as LUTs of a first size to re-express the components as LUTs of a second size, where the second size is smaller than the first. The LUTs of the second size are then repacked into a larger size where the repacked LUTs re-express the original LUT in an improved configuration. The configuration may be improved in that critical signals pass through fewer LUTs, fewer variables/inputs are connected between LUTs, and/or fewer LUTs are used. According to one aspect of the present invention, a LUT of the first size may be a LUT size having more 5 or more inputs, and a LUT of the second size may be a LUT having 3 or more inputs. The resynthesis procedure may be performed after synthesis 101, placement 102, and/or routing 103. A legalization procedure may be performed after resynthesis to cure any illegalities resulting from changes performed during resynthesis. The legalization procedure may be an incremental placement, incremental routing, and/or other procedures. According to an embodiment of the present invention, resynthesis may be performed during or immediately after synthesis 101, placement 102, and/or routing 103.

At 105, an assembly procedure is performed. The assembly procedure involves creating a data file that includes information determined by the compilation procedure described by 101-104. The data file may be a bit stream that may be used to program a target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

At 106, the target device is programmed with the data file. By programming the target with the data file, components on the target device are physically transformed to implement the system.

Figure 2:
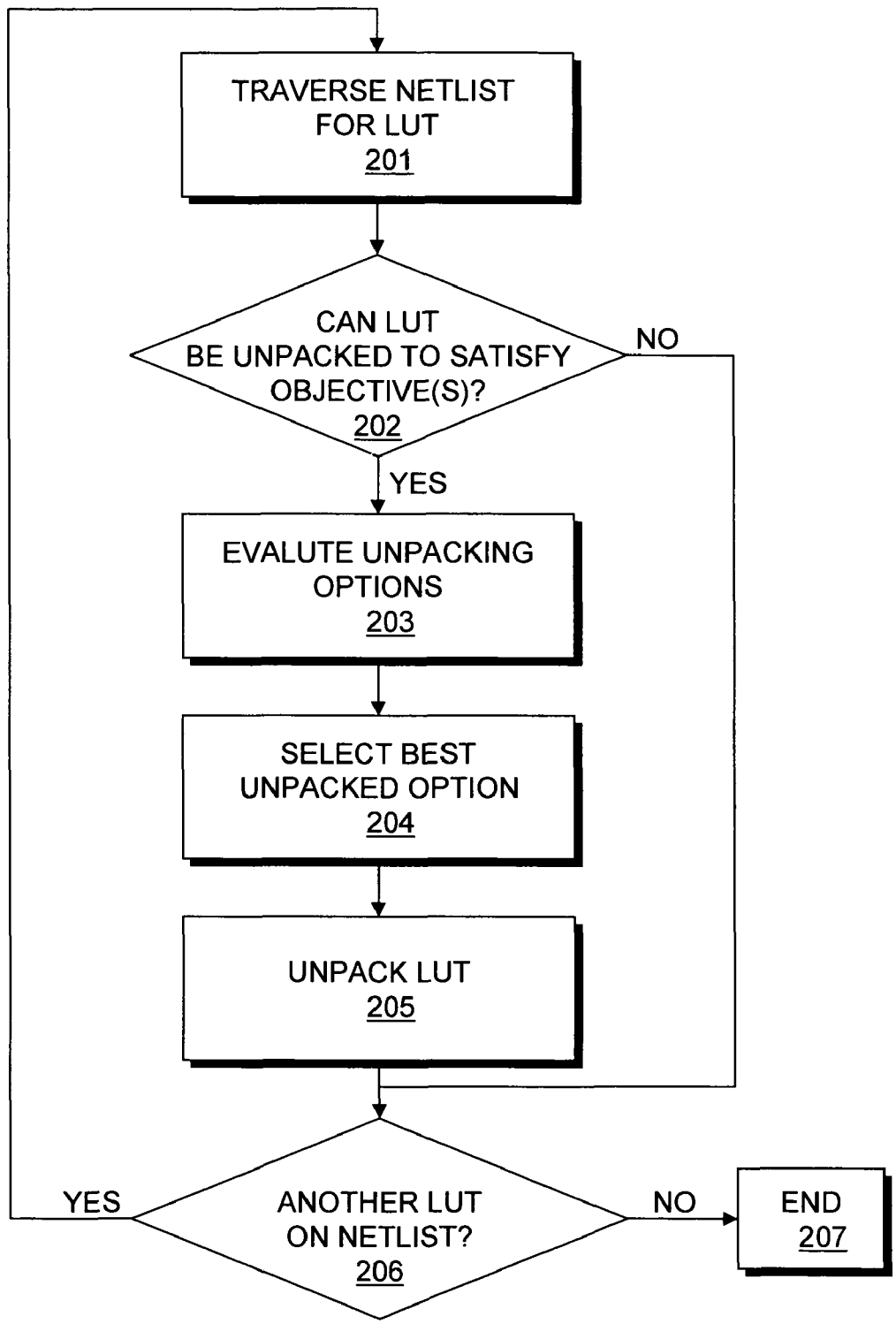
FIG. 2 is a flow chart illustrating a method for performing unpacking in resynthesis according to an exemplary embodiment of the present invention.

FIG. 2 is a flow chart illustrating a method for performing unpacking in resynthesis according to an exemplary embodiment of the present invention. At 201, a netlist describing the design for the system is traversed to identify LUTs in the system.

At 202, it is determined whether an identified LUT can be unpacked to satisfy an optimization objective. According to an embodiment of the present invention, a first optimization objective may include extracting a smaller LUT with variables that are not timing critical. This would allow for speeding up the timing critical connections. A second optimization objective may include extracting a smaller LUT with variables that have a high fanout. This would allow for potential reuse opportunities. A third optimization objective may include extracting a smaller LUT with variables that appear together in the netlist. This would allow for creating smaller LUTs that can be shared. A fourth optimization objective may include using a pre-existing smaller LUT to simplify the larger LUT.

The fourth optimization may be further described with the following illustration. A portion of a system design includes three LUTs implementing the following functions.

$$f=a+b+c+p+q+r$$

$$g=a+b+c$$

$$h=g+x+y+z$$

The LUT implementing function "g" may be re-used to simplify function "f" as follows.

$$f=g+p+q+r$$

With this simplification, "f" can be implemented using a 4 input LUT instead of a 6 input LUT. According to an embodiment of the present invention, the 4 input LUT implementing "g" is one that is already exists and is being used in the system.

With reference to 202, it should be appreciated that other objectives may be considered. If the LUT can be unpacked to satisfy one or more optimization objectives, control proceeds to 203. If the LUT cannot be unpacked to satisfy one or more optimization objectives, control proceeds to 206.

At 203, the unpacking options are evaluated. According to an embodiment of the present invention, a cost function may be used to evaluate the unpacking options. The cost function may assign a higher benefit value to an unpacking option that addresses speeding up of timing critical connections than to an unpacking option that addresses other objectives. The cost function may also assign a higher benefit value to an unpacking option that addresses a larger number of optimization objectives than to an unpacking option that addresses a fewer number of optimization objectives.

At 204, the best unpacking option is selected to implement. The netlist is updated to reflect the implementation.

At 205, control unpacks the LUT to satisfy one or more objectives. By unpacking only LUTs that can satisfy an optimization objective, embodiments of the present invention provide a filter where not all LUTs in the netlist are unpacked. The resynthesis procedure targets only a special set of LUTs. According to an embodiment of the present invention, unpacking involves re-expressing the LUT to one or more smaller LUTs. Unpacking may be achieved by performing decomposition. According to an embodiment of the present invention, a functional decomposition procedure is used for decomposition. Given a function $f(X, Y)$ defined over two sets of variables X and Y, functional decomposition finds subfunctions $g_1(Y)$, $g_2(Y)$, ... $g_k(Y)$ such that $f$ can be re-expressed in terms of gs: $f(X g_1(Y), g_2(Y), g_k(Y))$. The set of variables X is referred to as the free set and the set of variables Y is referred to as the bound set. If there are no variables common to X and Y, the decomposition is said to be disjoint. Otherwise, the decomposition is said to be non-disjoint.

According to an embodiment of the present invention, a plurality of unpacking iterations may be performed to generate a plurality of different unpacking options. The options may, for example, reflect a different objective that is achieved. According to an embodiment of the present invention, a plurality of unpacking procedures may be attempted to generate a satisfactory unpacking option. For example, a standard functional decomposition procedure may be performed first. If it is determined that the standard decomposition procedure does not yield a satisfactory unpacking option, an alternative decomposition such as algebraic decomposition or an alternate functional decomposition procedure, such as Shannon's decomposition, may be performed to generate a solution. It should be appreciated that various decomposition procedures may be used in an order other than the exemplary order described.

At 206, it is determined whether an additional LUT on the netlist exist to be examined. If it is determined that an additional LUT on the netlist exists to be examined, control returns to 201. If it is determined that no additional LUT on the netlist exists to be examined, control proceeds to 207 and terminates the procedure.

When timing information on the criticality of connections are stale or unavailable, additional measures may be taken by embodiments of the present invention to ensure that connections will not be lengthened and/or timing will not worsen with the resynthesis. According to an embodiment of the present invention, the depth of each variable is tracked such that the unpacking and packing options selected do not increase the number of levels of LUT traversal a signal is required to make.

Figure 3:
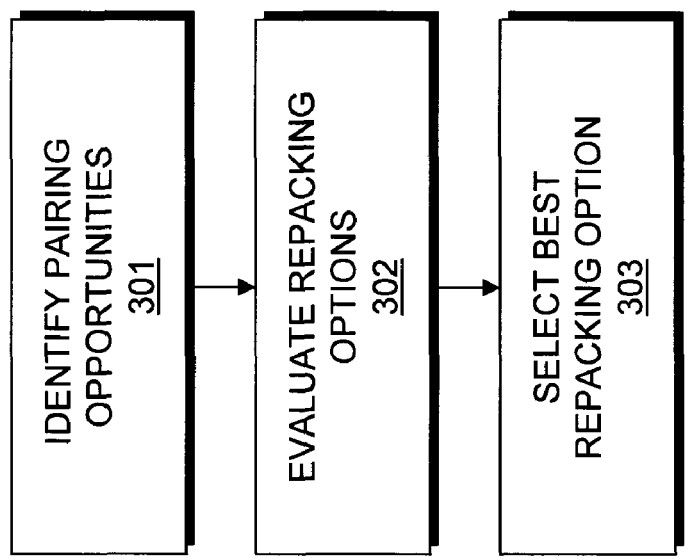
FIG. 3 illustrates a method for performing repacking according to an embodiment of the present invention.

FIG. 3 illustrates a method for performing repacking according to an embodiment of the present invention. At 301, the netlist is traversed to identify pairing opportunities. According to an embodiment of the present invention, identifying a pairing opportunity includes identifying two more LUTs that may be packed or combined together to form a new LUT. According to an embodiment of the present invention, the new LUT may be a larger LUT. Alternatively, the new LUT may have the same number or fewer inputs than the original LUT. When identifying pairing opportunities, adjacent node pairing may be considered. Each pairing opportunity is a repacking option.

At 302, the repacking options are evaluated. According to an embodiment of the present invention, a cost function may be used to evaluate the repacking options. The cost function may generate a benefit value for a repacking option based upon a number of criteria including the timing improvement for a critical signal, area improvement (which may include a reduction in the number of LUTs and/or size of LUTs), a reduction in the number of variables across LUTs resulting in fewer fanouts, and other criteria.

At 303, the best repacking option is selected to implement. The netlist is updated to reflect the implementation.

According to an alternate embodiment of the present invention, instead of using a first cost function to evaluate and eliminate unpacking options and a second cost function to evaluate and eliminate repacking options, repacking options are generated for all unpacking options. The repacking options are evaluated and eliminated using a single cost function.

FIGS. 1-3 are flow charts that illustrate embodiments of the present invention. Some of the techniques illustrated may be performed sequentially, in parallel or in an order other than that which is described and that the procedures described may be repeated. It should be appreciated that not all of the techniques described are required to be performed, that additional techniques may be added, and that some of the illustrated techniques may be substituted with other techniques.

Figure 4A:
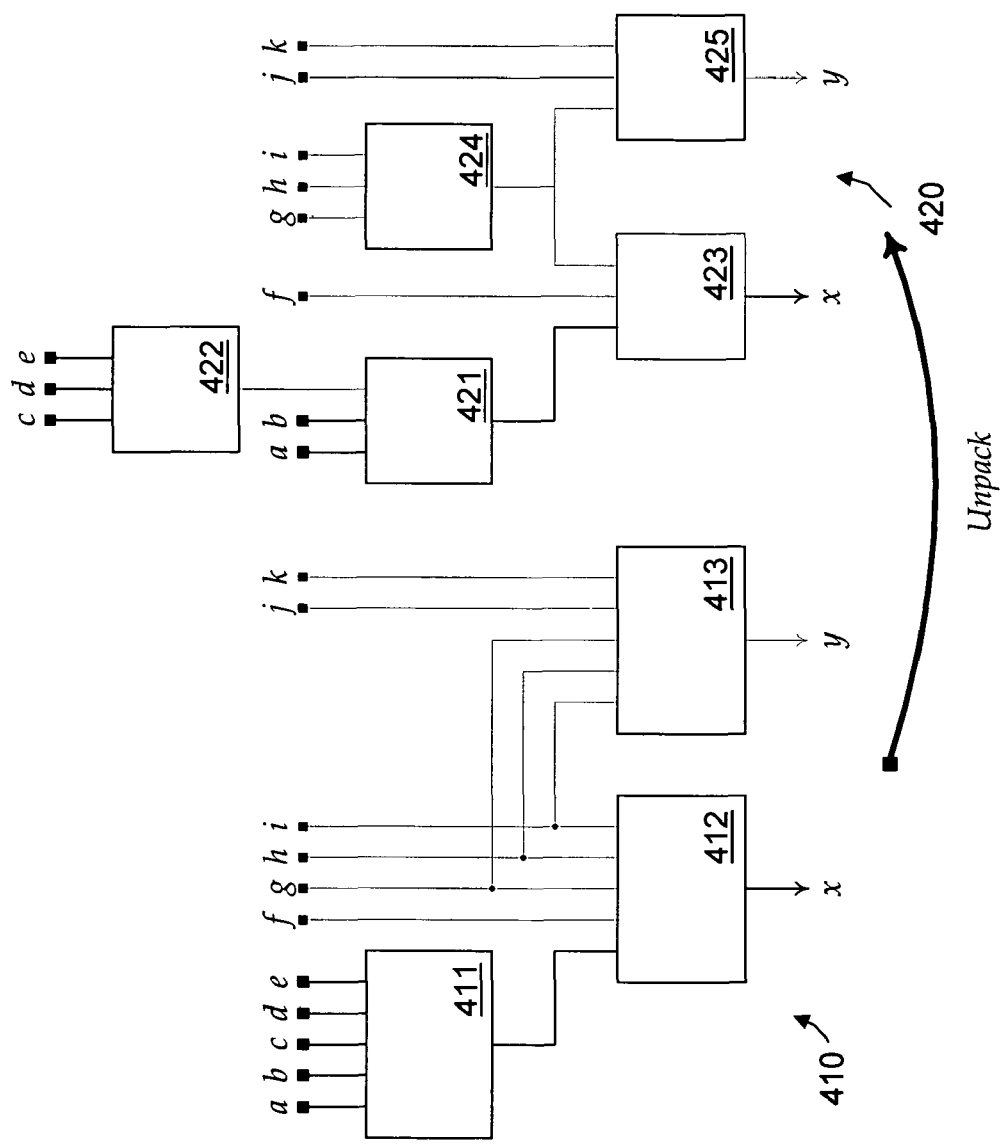
FIGS. 4a and 4b illustrate an example of LUT unpacking and repacking according to an embodiment of the present invention.

FIG. 4a illustrates an example of LUT unpacking according to an embodiment of the present invention. The initial LUT configuration 410 includes three 5 input LUTs, 411-413. LUT 411 has 5 inputs/variables, a, b, c, d, and e. Variables a and b represent critical inputs. LUT 412 has 5 inputs/variables, f, g, h, i, and the output from LUT 411. LUT 413 has 5 inputs/variables, g, h, i, j, and k.

The unpacked LUT configuration 420 includes five 3 input LUTs. By unpacking LUT 411, a first objective of extracting a smaller LUT with variables that are not timing critical is achieved. LUTs 421 and 422 are a re-expression of LUT 411 where variables c, d, and e are unpacked with LUT 422 and variables a and b are left intact with LUT 421. By unpacking LUT 412, a second objective of extracting a smaller LUT with variables that have a high fanout is achieved. LUT 423 and 424 are a re-expression of LUT 412 where variables g, h, and i are unpacked with LUT 424 and variable f is left intact with LUT 423. The unpacked LUT configuration 420 may be generated using a decomposition procedure such as functional decomposition, algebraic decomposition, or other techniques.

Figure 4B:
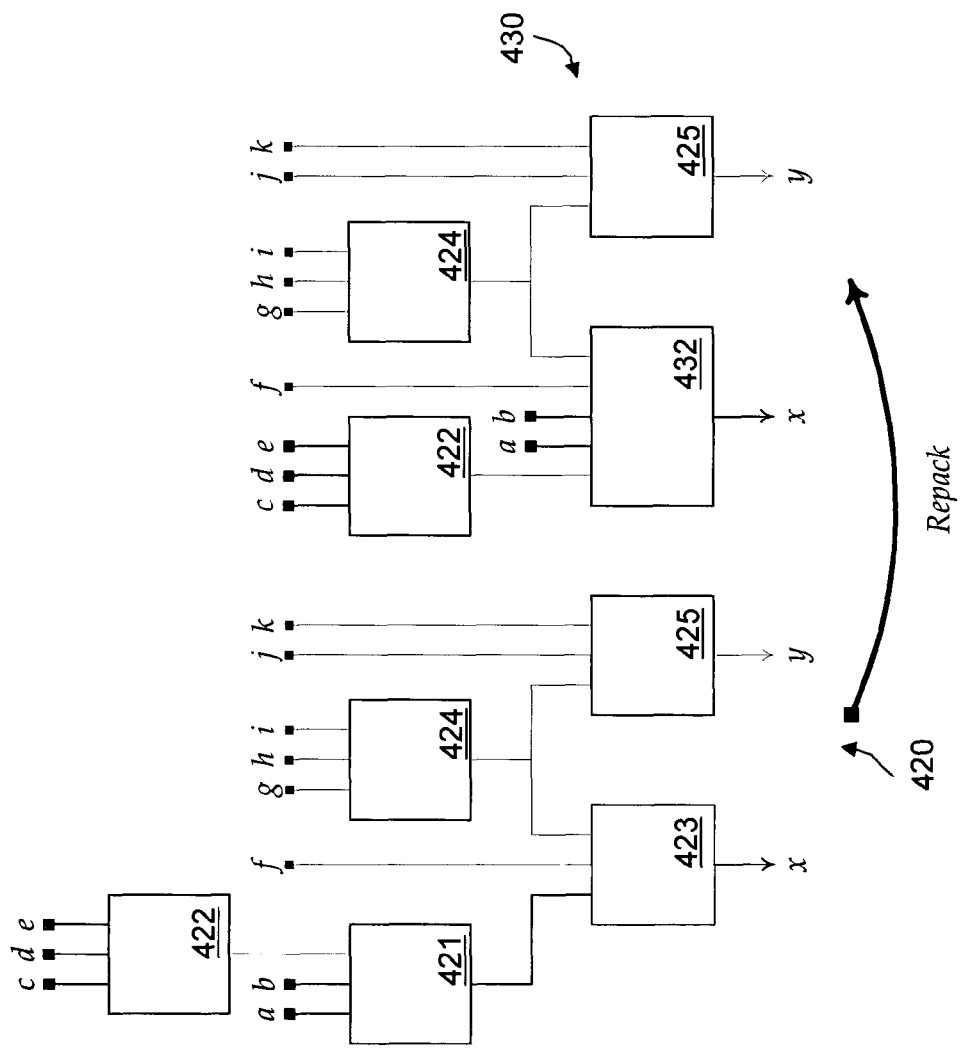

FIG. 4b illustrates an example of LUT repacking according to an embodiment of the present invention. The repacked LUT configuration 430 includes one 5 input LUT 432 and three 3 input LUTs 431, 424, and 425. As illustrated, LUTs 421 and 423 have been paired and repacked to allow variables a and b to traverse one fewer logic hop (LUT).

Figure 5:
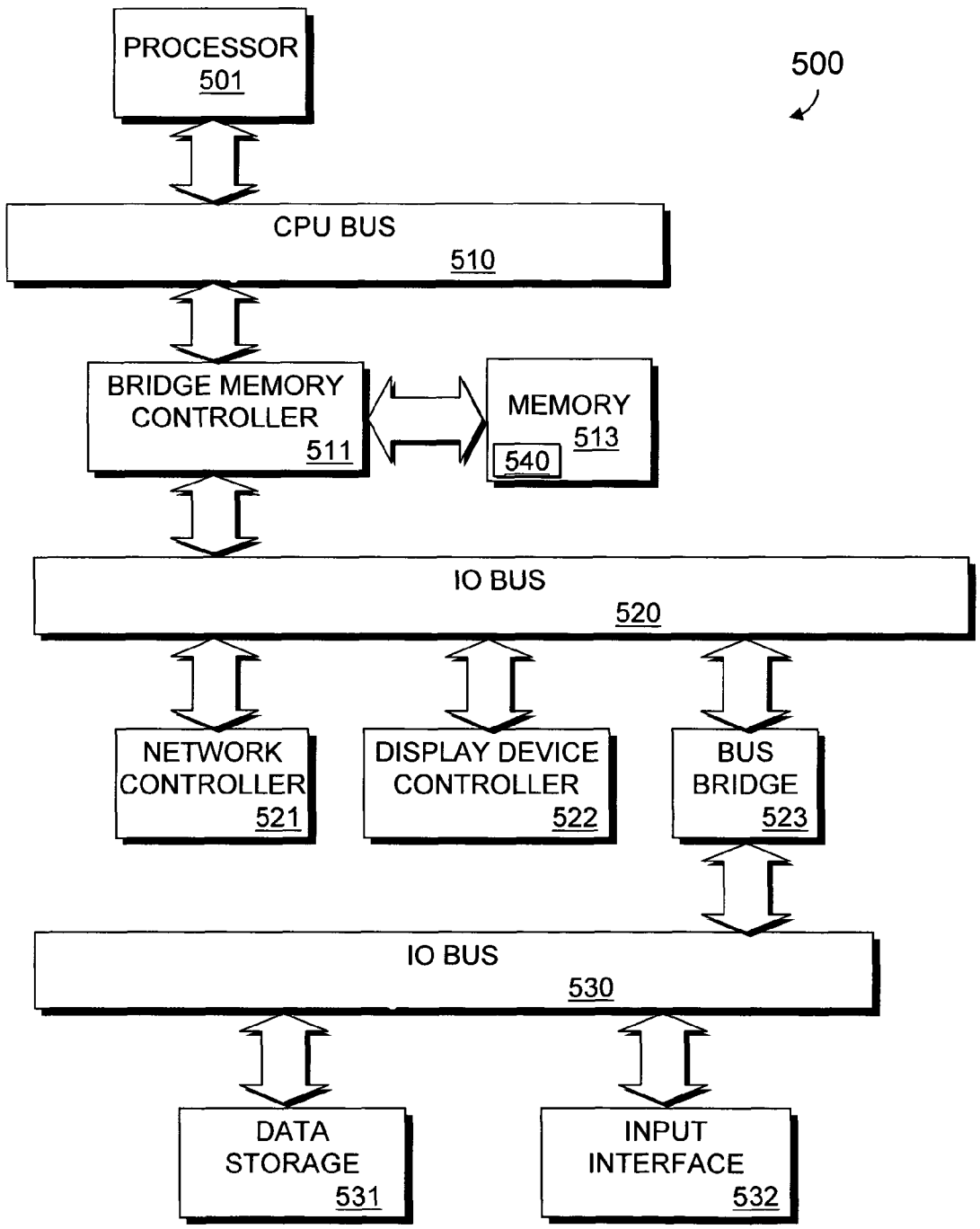
FIG. 5 illustrates a block diagram of a computer system implementing a system designer according to an exemplary embodiment of the present invention.

FIG. 5 illustrates a block diagram of an exemplary computer system 500 implementing a system designer according to an embodiment of the present invention. As shown, the computer system 500 includes a processor 501. The processor 501 is coupled to a CPU bus 510 that transmits data signals between the processor 501 and other components in the computer system 500.

The computer system 500 includes a memory 513. The memory 513 may be a dynamic random access memory device, a static random access memory device, and/or other memory device. The memory 513 may store instructions and code represented by data signals that may be executed by the processor 501. A bridge memory controller 511 is coupled to the CPU bus 510 and the memory 513. The bridge memory controller 511 directs data signals between the processor 501, the memory 513, and other components in the computer system 500 and bridges the data signals between the CPU bus 510, the memory 513, and a first IO bus 520.

The first IO bus 520 may be a single bus or a combination of multiple buses. The first IO bus 520 provides communication links between components in the computer system 500. A network controller 521 is coupled to the first IO bus 520. The network controller 521 may link the computer system 500 to a network of computers (not shown) and supports communication among the machines. A display device controller 522 is coupled to the first IO bus 520. The display device controller 522 allows coupling of a display device (not shown) to the computer system 500 and acts as an interface between the display device and the computer system 500.

A second IO bus 530 may be a single bus or a combination of multiple buses. The second IO bus 530 provides communication links between components in the computer system 500. A data storage device 531 is coupled to the second IO bus 530. The data storage device 531 may be a hard disk drive, a floppy disk drive, a CD-ROM device, a flash memory device or other mass storage device. An input interface 532 is coupled to the second IO bus 530. The input interface 532 allows coupling of an input device to the computer system 500 and transmits data signals from an input device to the computer system 100. A bus bridge 523 couples the first IO bus 520 to the second IO bus 530. The bus bridge 523 operates to buffer and bridge data signals between the first IO bus 520 and the second IO bus 530. It should be appreciated that computer systems having a different architecture may also be used to implement the computer system 500.

A system designer 540 may reside in memory 513 and be executed by the processor 501. The system designer 540 may operate to synthesize the system, place the system on a target device, route the system, resynthesize the system by unpacking and repacking LUTs to achieve predefined objectives that optimize a design for the system, assemble the system, and program a target device to implement the system.

Figure 6:
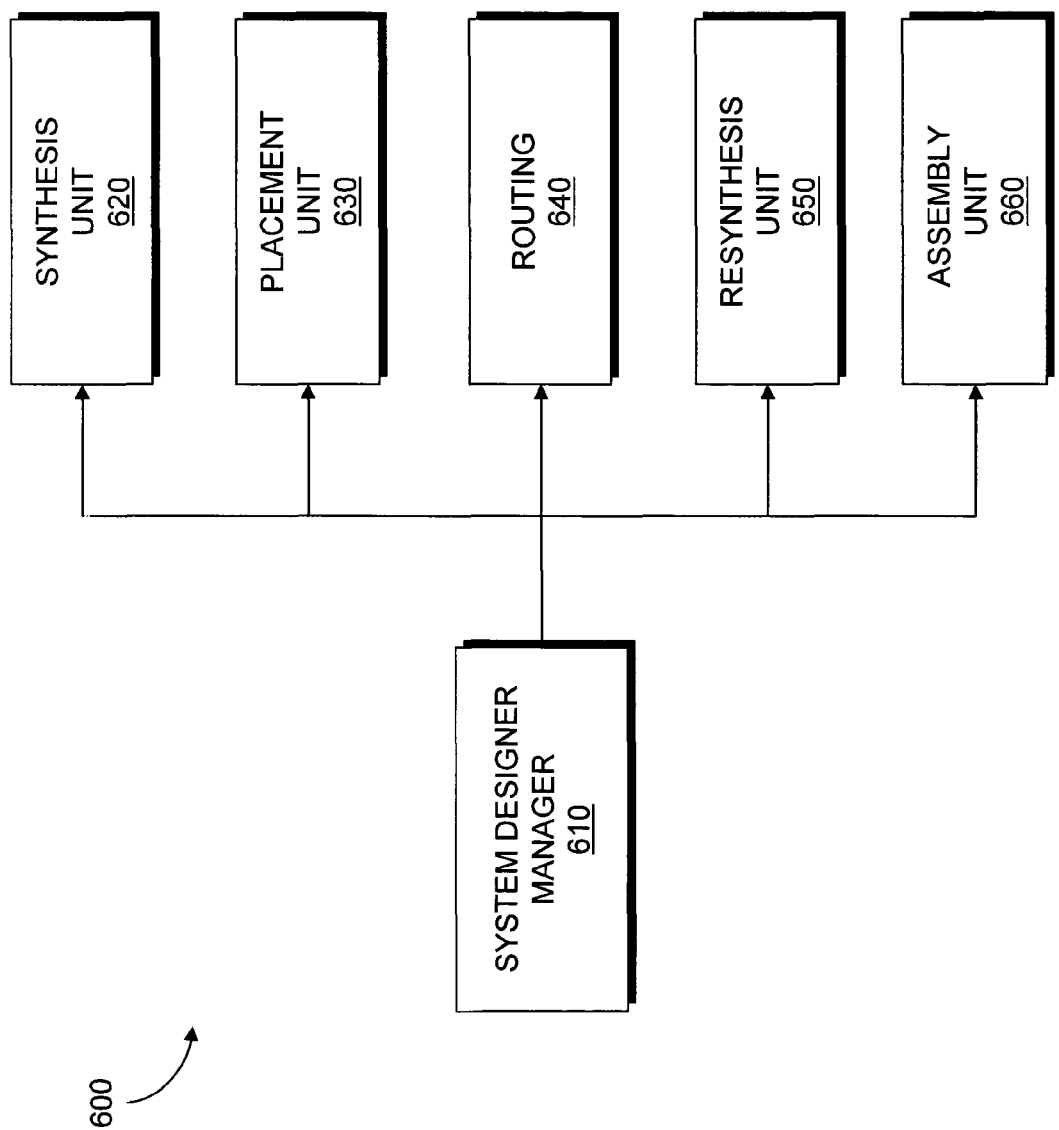
FIG. 6 is a block diagram of a system designer according to an exemplary embodiment of the present invention.

FIG. 6 illustrates a system designer 600 according to an exemplary embodiment of the present invention. The system designer 600 may be used to implement the system designer 540 shown in FIG. 5 and may perform procedures described in FIGS. 1-3. The system designer 600 may be a CAD tool for designing a system on a target device. The target device may be, for example, an ASIC, a structured ASIC, an FPGA, a programmable logic device (PLD), a printed circuit board (PCB), or other circuitry. FIG. 6 illustrates modules implementing an embodiment of the system designer 600. According to one embodiment, system design may be performed by a computer system (not shown) executing sequences of instructions represented by the modules shown in FIG. 6. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 600 includes a system designer manager 610. The system designer manager 610 is connected to and transmits data between the components of the system designer 600. The system design manager 610 may also perform elaboration on design information that is inputted into the system designer 600. Elaboration may include reviewing the design information to ensure that the syntax of the information is correct.

Block 620 represents a synthesis unit. The synthesis unit 620 generates a logic design of a system to be implemented in the target device. According to an embodiment of the system designer 600, the synthesis unit 620 takes a conceptual Hardware Description Language (HDL) design definition and generates an optimized logical representation of the system. The optimized logical representation of the system generated by the synthesis unit 620 may include a representation that has a minimized number of functional blocks and registers, such as logic gates and logic elements, required for the system. Alternatively, the optimized logical representation of the system generated by the synthesis unit 620 may include a representation that has a reduced depth of logic and that generates a lower signal propagation delay. The synthesis unit 620 also determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system. In an embodiment where the target device is a FPGA, the components could be logical elements or adaptive logic modules. In an embodiment where the target device is an ASIC, the components could be gates or standard cells. In an embodiment where the target device is a structured ASIC, the technology-mapped netlist may contain components that can be implemented in the structured ASIC fabric, such as RAM blocks, multiplier blocks, and gates from a library of gates.

Block 630 represents a placement unit. The placement unit 630 places the system on to the target device by determining which components or areas on the target device are to be used for specific functional blocks and registers. According to an embodiment of the system designer 600, the placement unit 630 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 630 may utilize a cost function in order to determine a good assignment of resources on the target device.

Block 640 represents a routing unit. The routing unit 640 determines the routing resources on the target device to use to provide interconnection between the components implementing functional blocks and registers of the logic design.

Block 650 represents a resynthesis unit. The resynthesis unit 650 may revisit design decisions made during synthesis following procedures that have an impact on delay and area such as clustering or placement. As LUT sizes get larger it may become difficult to estimate the effect of technology mapping on the netlist using traditional techniques. Thus, it may be useful to revisit synthesis decisions after technology mapping, placement, and/or routing has been performed. According to an embodiment of the present invention, the resynthesis unit 650 may make small changes to a network of large LUTs. Large LUTs having 5 or more inputs are unpacked into (re-expressed as) smaller LUTs having 3 or more inputs. Some smaller LUTs having 3 or more inputs are reused to re-express the large LUTs. Some of the smaller LUTs having 3 or more inputs are repacked back into LUTs having 5 or more inputs as appropriate to achieve optimization objectives.

Block 660 represents an assembly unit. The assembly unit 660 creates a data file that includes information determined by the compilation procedure performed by the system designer 600. The data file may be a bit stream that may be used to program a target device. According to an embodiment of the present invention, the data file generated may be transmitted to another computer system to allow the design of the system to be further processed. Alternatively, the data file may be transmitted to another computer system which may be used to program the target device according to the system design. By programming the target device with the data file, components on the target device are physically transformed to implement the system. It should be appreciated that the design of the system may also be output in other forms such as on a display device or other medium.

Figure 7:
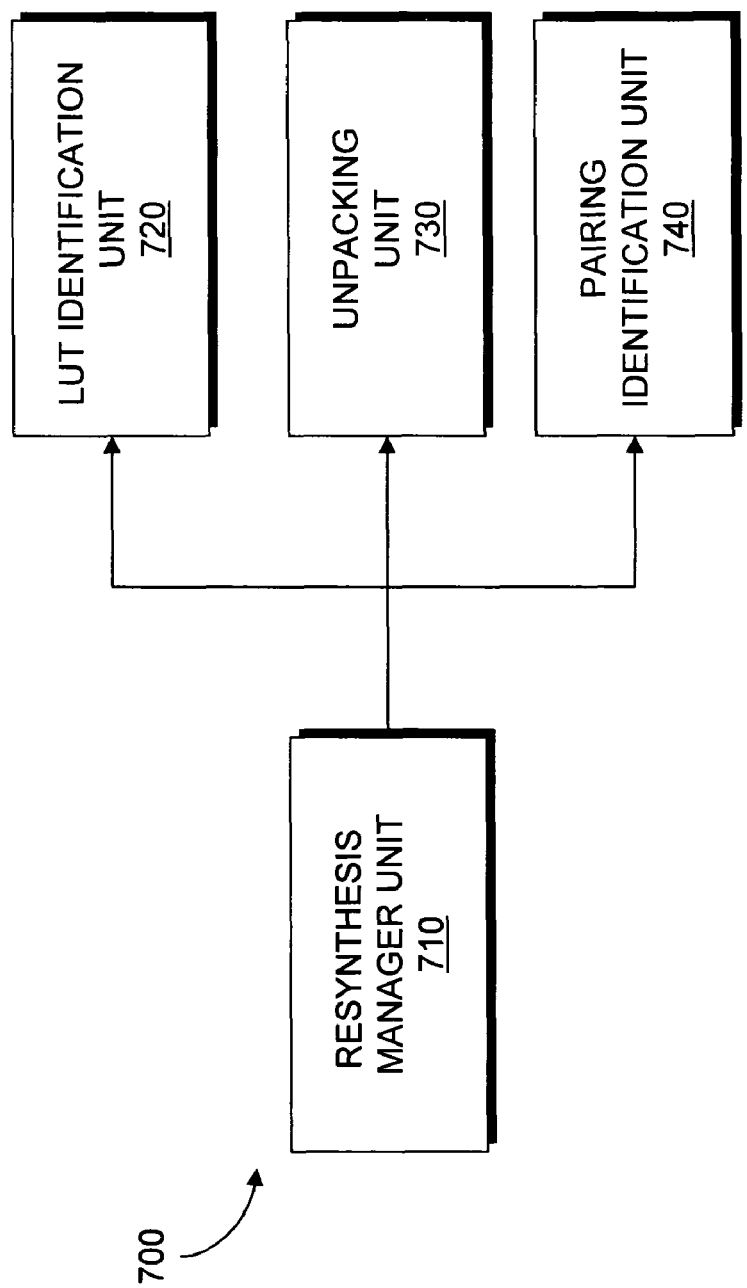
FIG. 7 is a block diagram of a resynthesis unit according to an embodiment of the present invention.

FIG. 7 is a block diagram of a resynthesis unit 700 according to an embodiment of the present invention. The resynthesis unit 700 may be used to implement the resynthesis unit 650 illustrated in FIG. 6. The resynthesis unit 700 includes a resynthesis manager unit 710. The resynthesis manager unit 710 is coupled to and transmits information between components in the resynthesis unit 700

Block 720 represents a LUT identification unit. The LUT identification unit 720 identifies LUTs which may be unpacked to satisfy an optimization objective. According to an embodiment of the present invention, a first optimization objective may include extracting a smaller LUT with variables that are not timing critical. This would allow for speeding up the timing critical connections. A second optimization objective may include extracting a smaller LUT with variables that have a high fanout. This would allow for potential reuse opportunities. A third optimization objective may include extracting a smaller LUT with variables that appear together in the netlist. This would allow for creating smaller LUTs that can be shared. A fourth optimization objective may include using a pre-existing smaller LUT to simplify the larger LUT. It should be appreciated that other objectives may be considered by the LUT identification unit 720.

Block 730 represents an unpacking unit 730. The unpacking unit 730 unpacks LUTs to satisfy one or more objectives. According to an embodiment of the present invention, unpacking involves re-expressing a LUT as one or more smaller LUTs. Unpacking may be achieved by performing decomposition such as functional decomposition or algebraic decomposition. According to an embodiment of the present invention, a plurality of unpacking iterations may be performed on a LUT to generate a plurality of different unpacking options. The options may, for example, reflect a different objective that is achieved. According to an embodiment of the present invention, a plurality of unpacking procedures may be attempted to generate a satisfactory packing option or different unpacking options.

The resynthesis manager unit 710 evaluates the unpacking options generated by the unpacking unit 730. According to an embodiment of the present invention, a cost function may be used to evaluate the unpacking options. The best unpacking option is selected to be implemented. The netlist of the system is updated to reflect the implementation.

Block 740 represents a pairing identification unit. The pairing identification unit 740 identifies pairing opportunities in a netlist where two or more LUTs that may be repacked or combined together to form a larger LUT having a larger number of inputs.

The resynthesis manager unit 710 evaluates the packing options generated by the pairing identification unit 740. According to an embodiment of the present invention, a cost function may be used to evaluate the unpacking options. The cost function may generate a benefit value for a repacking option based upon a number of criteria including the timing improvement for a critical signal, a reduction in the number of LUTs, a reduction in the number of variables across LUTs resulting in fewer fanouts, and other criteria. The best packing option is selected to be implemented. The netlist of the system is updated to reflect the implementation.

Embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 8:
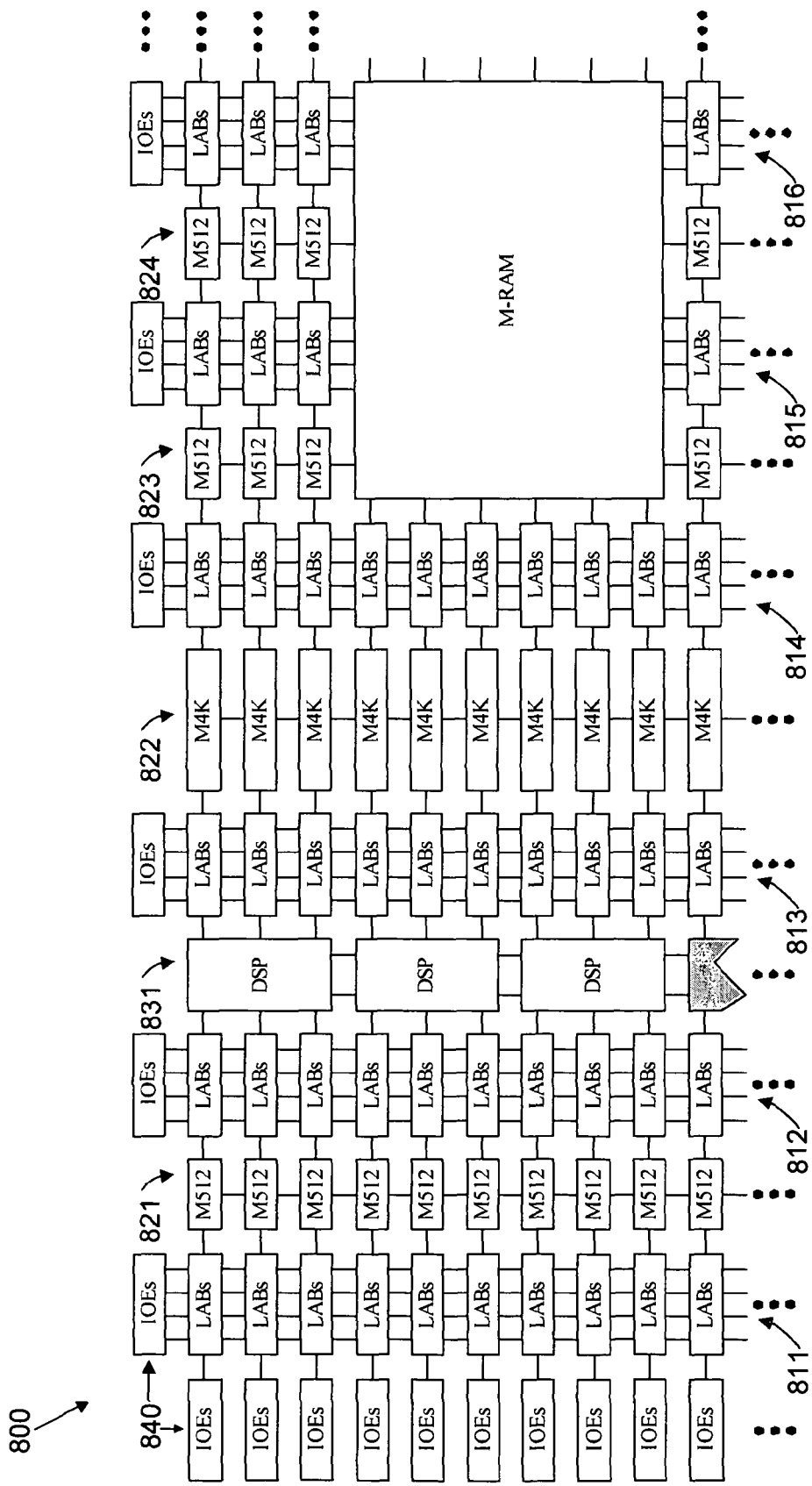
FIG. 8 illustrates an exemplary target device according to an embodiment of the present invention.

FIG. 8 illustrates a device 800 that may be used to implement a target device according to an embodiment of the present invention. The device 800 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 800. Columns of LABs are shown as 811-816. It should be appreciated that the logic block may include additional or alternate components.

The device 800 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 800. Columns of memory blocks are shown as 821-824.

The device 800 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 800 and are shown as 831.

The device 800 includes a plurality of input/output elements (IOEs) 840. Each IOE feeds an IO pin (not shown) on the device 800. The IOEs 840 are located at the end of LAB rows and columns around the periphery of the device 800. Each IOE may include a bidirectional IO buffer and a plurality of registers for registering input, output, and output-enable signals.

The device 800 may include routing resources such as LAB local interconnect lines, row interconnect lines ("H-type wires"), and column interconnect lines ("V-type wires") (not shown) to route signals between components on the target device.

Embodiments of the present invention provide a number of benefits over resynthesis techniques utilized in the past. Firstly, unpacking procedures may generally be performed in a fast manner. A number of 64-bit word tricks may be utilized to perform decomposition. Secondly, repacking procedures may also be performed in a fast manner. Repacking does not require repeating technology mapping. A pairing scheme is sufficient to construct a final netlist without cut enumeration.

Thirdly, the resynthesis techniques disclosed do not make drastic changes to the netlist structure. Small pieces of LUTs are moved around.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
   unpacking a look up table (LUT) to form a plurality of LUTs of a smaller size upon determining that the LUT can be unpacked to satisfy one or more predefined objectives; and
   repacking the plurality of LUTs such that the design for the system is improved, wherein at least one of the unpacking and repacking is performed by a processor.

2. The method of claim 1, wherein the LUT has 5 or more inputs and the smaller size is a LUT having fewer than 5 inputs.

3. The method of claim 1, wherein one predefined objective is re-expressing a portion of the LUT with the plurality of LUTs, wherein the plurality of LUTs comprises variables that are not timing critical.

4. The method of claim 1, wherein one predefined objective is re-expressing a portion of the LUT with the plurality of LUTs, wherein the plurality of LUTs comprises variables that have high fanout.

5. The method of claim 1, wherein one predefined objective is re-expressing a portion of the LUT with the plurality of LUTs, wherein the plurality of LUTs comprises variables that appear together in a netlist.

6. The method of claim 1, wherein one predefined objective is re-expressing a portion of the LUT with a smaller LUT that has existing assignments.

7. The method of claim 1, wherein unpacking the LUT comprises:
   generating a plurality of re-expressions of the LUT according to the one or more objectives using one or more decomposition procedures;
   evaluating the plurality of re-expressions with a cost function; and
   selecting an appropriate re-expression as an unpacked solution.

8. The method of claim 7, wherein the decomposition procedure comprises functional decomposition.

9. The method of claim 7, wherein the decomposition procedure comprises Shannon's decomposition.

10. The method of claim 7, wherein the decomposition procedure comprises algebraic decomposition.

11. The method of claim 1, wherein unpacking the LUT comprises:
    generating a first re-expressions of the LUT according to the one or more objectives using a first type of decomposition procedures;
    generating a second re-expressions of the LUT according to the one or more objectives using a second type of decomposition procedures;
    evaluating the re-expressions with a cost function; and
    selecting a best re-expression from the first re-expressions and the second re-expressions as an unpacked solution.

12. The method of claim 1, wherein the unpacking and repacking is performed immediately after synthesis.

13. The method of claim 1, wherein the unpacking and repacking is performed immediately after placement.

14. The method of claim 1, wherein the unpacking and repacking is performed immediately after routing.

15. The method of claim 1 further comprising performing a legalization procedure after the unpacking and repacking.

16. The method of claim 1, wherein repacking comprises:
    evaluating pairing opportunities using a cost function; and
    selecting an appropriate pairing opportunity to repack.

17. The method of claim 16, wherein the cost function accounts for timing improvement.

18. The method of claim 16, wherein the cost function accounts for area improvement in the system.

19. The method of claim 16, wherein the cost function accounts for a number of inputs in the plurality of LUTs to be paired.

20. The method of claim 16, wherein the cost function accounts for a number of variables transmitted between the plurality of LUTs in the system.

21. The method of claim 16, wherein the cost function accounts for an improvement in dynamic power consumption.

22. A non-transitory computer-readable medium including sequences of instructions stored thereon for causing a computer to execute a method comprising:
    unpacking a look up table (LUT) to form a plurality of LUTs of a smaller size upon determining that the LUT can be unpacked to satisfy one or more predefined objectives; and
    repacking the plurality of LUTs such that the design for a system is improved.

23. The non-transitory computer-readable medium of claim 22, wherein the LUT has 5 or more inputs and the smaller size is a LUT having fewer than 5 inputs.

24. The non-transitory computer-readable medium of claim 22, wherein the unpacking re-expresses a portion of a LUT with the plurality of LUTs, wherein the plurality of LUTs comprises variables that appear together in a netlist.

25. The non-transitory computer-readable medium of claim 22, wherein the unpacking re-expresses a portion of the LUT with a smaller LUT having existing assignments.

26. The non-transitory computer-readable medium of claim 22, wherein unpacking comprises:
    generating a plurality of re-expressions of a LUT according to the one or more objectives using one or more decomposition procedures;
    evaluating the plurality of re-expressions with a cost function; and
    selecting a best re-expression as an unpacked solution.

27. A resynthesis unit, comprising:
    a look up table (LUT) identification unit operable to identify LUTs in a design for a system that can be unpacked to satisfy one or more predefined objectives; and
    an unpacking unit operable to unpack a LUT identified to form a plurality of LUTs of a smaller size; and
    resynthesis manager unit operable to evaluate unpacking solutions generated by the unpacking unit and to implement an unpacking solution evaluated with having an improved benefit.

28. The resynthesis unit of claim 27, wherein the LUT identified has 5 or more inputs and each LUT of the plurality of LUTs of the smaller size comprises fewer than 5 inputs.

29. The resynthesis unit of claim 27, wherein an objective is re-expressing a portion of the LUT with a smaller LUT that has existing assignments.

30. The resynthesis unit of claim 27, further comprising a pairing identification unit operable to identify LUTs of the plurality of LUTS to repack to improve the system.

\* \* \* \* \*